(12) United States Patent
Allan et al.

(10) Patent No.: US 8,315,096 B2
(45) Date of Patent: Nov. 20, 2012

(54) METHOD AND APPARATUS TO IMPLEMENT A RESET FUNCTION IN A NON-VOLATILE STATIC RANDOM ACCESS MEMORY

(75) Inventors: James D Allan, Colorado Springs, CO (US); Jayant Ashokkumar, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/216,546

(22) Filed: Aug. 24, 2011

(65) Prior Publication Data

US 2012/0213027 A1     Aug. 23, 2012

Related U.S. Application Data

(63) Continuation of application No. 11/644,165, filed on Dec. 22, 2006, now abandoned.

(51) Int. Cl.
*G11C 14/00* (2006.01)

(52) U.S. Cl. ............. 365/185.08; 365/154; 365/189.16; 365/226

(58) Field of Classification Search ............. 365/185.08, 365/189.16, 154, 226
See application file for complete search history.

(56) References Cited

U.S. PATENT DOCUMENTS

| | | |
|---|---|---|
| 3,636,530 A | 1/1972 | Mark et al. |
| 3,676,717 A | 7/1972 | Lockwood |
| 3,950,737 A | 4/1976 | Uchida et al. |
| 4,044,343 A | 8/1977 | Uchida |
| 4,128,773 A | 12/1978 | Troutman et al. |
| 4,142,176 A | 2/1979 | Dozier |
| 4,158,241 A | 6/1979 | Takemae et al. |
| 4,271,487 A | 6/1981 | Craycraft et al. |
| 4,342,101 A | 7/1982 | Edwards |
| 4,510,584 A | 4/1985 | Dias et al. |
| 4,527,255 A | 7/1985 | Keshtbod |
| 4,541,073 A | 9/1985 | Brice et al. |
| 4,651,303 A | 3/1987 | Dias et al. |
| 4,703,456 A | 10/1987 | Arakawa |
| 4,799,194 A | 1/1989 | Arakawa |
| 4,959,812 A | 9/1990 | Momodomi et al. |
| 4,975,873 A | 12/1990 | Nakabayashi et al. |
| 4,980,859 A | 12/1990 | Guterman et al. |
| 4,984,211 A | 1/1991 | Tran |

(Continued)

FOREIGN PATENT DOCUMENTS

JP    1043897 A    2/1989

OTHER PUBLICATIONS

Wikipedia "Image: 6t-SRAM-cell.png"; <http://en.wikipedia.org/wiki/Image:6t-SRAM-cell.png>; Nov. 8, 2006; 5 pages.

(Continued)

*Primary Examiner* — Pho M Luu

(57) ABSTRACT

The state of a volatile memory cell is set by grounding a power supply to the volatile memory cell and driving a first bit line to the volatile memory cell to a first defined state. The first defined state of the first bit line is controllable independently of a defined state of a second bit line to the volatile memory cell. A word line of the volatile memory cell is driven to a word line state, and the power supply to the volatile memory cell is ungrounded.

20 Claims, 6 Drawing Sheets

U.S. PATENT DOCUMENTS

| | | | |
|---|---|---|---|
| 5,008,856 | A | 4/1991 | Iwahashi |
| 5,051,958 | A | 9/1991 | Arakawa |
| 5,065,362 | A | 11/1991 | Herdt et al. |
| 5,097,449 | A | 3/1992 | Cuevas |
| 5,121,359 | A | 6/1992 | Steele |
| 5,189,641 | A | 2/1993 | Arakawa |
| 5,212,663 | A | 5/1993 | Leong |
| 5,262,998 | A | 11/1993 | Mnich et al. |
| 5,345,418 | A | 9/1994 | Challa |
| 5,345,424 | A | 9/1994 | Landgraf |
| 5,349,222 | A | 9/1994 | Shimoji |
| 5,546,341 | A | 8/1996 | Suh et al. |
| 5,563,839 | A | 10/1996 | Herdt et al. |
| 5,589,700 | A | 12/1996 | Nakao |
| 5,602,776 | A | 2/1997 | Herdt et al. |
| 5,723,888 | A | 3/1998 | Yu |
| RE35,838 | E | 7/1998 | Momodomi et al. |
| 5,798,547 | A | 8/1998 | Urai |
| 5,799,200 | A | 8/1998 | Brant et al. |
| 5,828,599 | A | 10/1998 | Herdt |
| 5,847,577 | A | 12/1998 | Trimberger |
| 5,892,712 | A | 4/1999 | Hirose et al. |
| 5,914,895 | A | 6/1999 | Jenne |
| 5,978,265 | A | 11/1999 | Kirisawa |
| 6,026,018 | A | 2/2000 | Herdt et al. |
| 6,038,176 | A | 3/2000 | Shyu |
| 6,097,629 | A | 8/2000 | Dietrich et al. |
| 6,163,048 | A | 12/2000 | Hirose et al. |
| 6,249,479 | B1 | 6/2001 | Tanzawa et al. |
| 6,414,873 | B1 | 7/2002 | Herdt |
| 6,920,061 | B2 | 7/2005 | Bhavnagarwala et al. |
| 7,292,481 | B2 | 11/2007 | Takeda |
| 7,369,438 | B2 * | 5/2008 | Lee .......................... 365/185.17 |
| 7,385,857 | B2 * | 6/2008 | Dalton ..................... 365/185.29 |
| 7,518,916 | B2 * | 4/2009 | Ashokkumar et al. ... 365/185.07 |
| 7,539,054 | B2 * | 5/2009 | Ashokkumar et al. ... 365/185.07 |
| 7,710,776 | B2 * | 5/2010 | Johal et al. ............... 365/185.08 |
| 2008/0151654 | A1 * | 6/2008 | Allan et al. .............. 365/189.16 |

OTHER PUBLICATIONS

Wikipedia "Static Random Access Memory"; <http://en.wikipedia.org/wiki/Static_random_access_memory>; Jul. 18, 2006; 3 pages.
Wikipedia; Search Results for "Gate Array"; <http://en.wikipedia.org/wiki/Gate_array>; last updated Apr. 29, 2006; 1 page.
Wikipedia; Search Results for "Non-Volatile Memory"; <http://en.wikipedia.org/wiki/Nonvolatile_memory>; last modified Jun. 14, 2006; 3 pages.
"nvSRAM Basics," Simtek 1999 Data Book, Chapter 8; 8-1 through 8-5; 5 pages, Dec. 1999.
Donaldson et al., "SNOS 1K x8 Static Nonvolatile RAM," IEEE Journal of Solid-State Circuits, vol. SC-17; No. 5, Oct. 1982, pp. 847-851, 5 pages.
Frohman-Bentchkowsky, "The Methal-Nitrice-Oxide-Silicon (MNOS) Transistor—Characteristics and Applications," Proceedings of the IEEE, vol. 58, No. 8, Aug. 1970, pp. 1207-1219; 13 pages.
Herdt et al., "Analysis, Measurement, and Simulation of Dynamic Write Inhibit in a nvSRAM Cell," 1992, IEEE; 6 pages, Dec. 1992.
Hirose et al., "Non-Volatile Latch Description," NVX Corporation, Nov. 1, 1995; 23 pages.
Hirose et al., "Non-Volatile Latch for FPGA Devices," NVX Corporation, Jan. 10, 1995; 6 pages.
Hirose et al., "Non-Volatile Latch for Semiconductor Devices," NVX Corporation, Sep. 8, 1994; 13 pages.
Simtek "nvSRAM versus Battery Backed-up SRAM"; 5 pages, Aug. 24, 2011.
Simtek Technology Overview "Simtek nvSRAM"; 1 page, Jul. 6, 2006.
Simtek, "QuantumTrap nvSRAM Technology," 1999 Simtek Corporation; 5 pages, Dec. 1999.
Simtek, "The Simtek Nonvolatile SRAM," http://www.simtek.com/product-information/SimtekCurrentProducts.pdf; 6 pages, Aug. 24, 2011.
TechWeb: TechEncyclopedia; Search Results for "Gate Array"; <http://www.techweb.com/encyclopedia>; Jul. 20, 2006; 1 page.
USPTO Advisory Action for U.S. Appl. No. 09/051,700 dated Jun. 23, 2000; 1 page.
USPTO Final Rejection for U.S. Appl. No. 07/361,033 dated Jan. 18, 1991; 5 pages.
USPTO Final Rejection for U.S. Appl. No. 09/051,700 dated Apr. 10, 2000; 8 pages.
USPTO Non-Final Rejection for U.S. Appl. No. 07/361,033 dated Jun. 12, 1990; 11 pages.
USPTO Non-Final Rejection for U.S. Appl. No. 07/658,559 dated Oct. 29, 1992; 5 pages.
USPTO Non-Final Rejection for U.S. Appl. No. 08/413,360 dated Nov. 6, 1995; 4 pages.
USPTO Non-Final Rejection for U.S. Appl. No. 08/549,483 dated May 29, 1996; 5 pages.
USPTO Non-Final Rejection for U.S. Appl. No. 08/926,611 dated Jul. 7, 1998; 5 pages.
USPTO Non-Final Rejection for U.S. Appl. No. 09/051,700 dated Oct. 7, 1999; 9 pages.
USPTO Non-Final Rejection for U.S. Appl. No. 09/136,694 dated Nov. 12, 1999; 8 pages.
USPTO Non-Final Rejection for U.S. Appl. No. 09/137,914 dated Jun. 9, 1999; 4 pages.
USPTO Non-Final Rejection for U.S. Appl. No. 09/613,874 dated May 28, 2002; 6 pages.
USPTO Non-Final Rejection for U.S. Appl. No. 09/613,874 dated Dec. 28, 2001; 5 pages.
USPTO Non-Final Rejection for U.S. Appl. No. 09/626,267 dated Mar. 28, 2001; 5 pages.
USPTO Non-Final Rejection for U.S. Appl. No. 09/681,317 dated Jul. 24, 2001; 9 pages.
USPTO Notice of Allowance for U.S. Appl. No. 07/361,033 dated Apr. 30, 1991; 3 pages.
USPTO Notice of Allowance for U.S. Appl. No. 07/658,559 dated Jan. 6, 1993; 2 pages.
USPTO Notice of Allowance for U.S. Appl. No. 08/413,360 dated Mar. 26, 1996; 2 pages.
USPTO Notice of Allowance for U.S. Appl. No. 08/549,483 dated Aug. 8, 1996; 3 pages.
USPTO Notice of Allowance for U.S. Appl. No. 08/692,571 dated Jul. 2, 1997; 2 pages.
USPTO Notice of Allowance for U.S. Appl. No. 08/846,558 dated Jul. 20, 1998; 3 pages.
USPTO Notice of Allowance for U.S. Appl. No. 08/926,611 dated Dec. 14, 1998; 3 pages.
USPTO Notice of Allowance for U.S. Appl. No. 09/051,700 dated Jul. 20, 2000; 4 pages.
USPTO Notice of Allowance for U.S. Appl. No. 09/136,694 dated Apr. 24, 2000; 4 pages.
USPTO Notice of Allowance for U.S. Appl. No. 09/137,914 dated Oct. 29, 1999; 1 page.
USPTO Notice of Allowance for U.S. Appl. No. 09/164,531 dated Jun. 21, 1999; 2 pages.
USPTO Notice of Allowance for U.S. Appl. No. 09/613,874 dated Nov. 19, 2002; 7 pages.
USPTO Notice of Allowance for U.S. Appl. No. 09/626,267 dated Aug. 7, 2001; 5 pages.
USPTO Notice of Allowance for U.S. Appl. No. 09/681,317 dated Mar. 13, 2002; 4 pages.
USPTO Notice of Allowance for U.S. Appl. No. 11/644,165 dated Feb. 3, 2009; 8 pages.
USPTO Notice of Allowance for U.S. Appl. No. 11/644,165 dated Feb. 22, 2010; 8 pages.
USPTO Notice of Allowance for U.S. Appl. No. 11/644,165 dated Feb. 22, 2011; 9 pages.
USPTO Notice of Allowance for U.S. Appl. No. 11/644,165 dated Jun. 26, 2009; 8 pages.
USPTO Notice of Allowance for U.S. Appl. No. 11/644,165 dated Aug. 9, 2011; 8 pages.
USPTO Notice of Allowance for U.S. Appl. No. 11/644,165 dated Oct. 26, 2009; 8 pages.
USPTO Requirement Restriction for U.S. Appl. No. 09/136,694 dated Aug. 17, 1999; 4 pages.
USPTO Requirement Restriction for U.S. Appl. No. 09/613,874 dated Aug. 14, 2001; 4 pages.
USPTO Requirement Restriction for U.S. Appl. No. 09/626,267 dated Dec. 1, 2000; 4 pages.

* cited by examiner

METHOD AND APPARATUS TO IMPLEMENT A RESET FUNCTION IN A NON-VOLATILE STATIC RANDOM ACCESS MEMORY

This application is a continuation of U.S. patent application Ser. No. 11/644,165, filed Dec. 22, 2006, now abandoned, which is incorporated herein by reference in its entirety.

BACKGROUND OF THE INVENTION

1. Field of the Invention

The present invention is generally directed to memory, and more particularly to implementing a reset function in a non-volatile Static Random Access Memory (nvSRAM) cell or array.

2. The Relevant Technology

Semiconductor memory devices are widely used in the computer and electronics industries as a means for retaining digital information. A typical semiconductor memory device is comprised of a large number of memory elements, known as memory cells, that are each capable of storing a single digital bit. The memory cells are arranged into a plurality of separately addressable memory locations, each being capable of storing a predetermined number of digital data bits. All of the memory cells in the device are generally located upon a single semiconductor chip which is contacted and packaged for easy insertion into a computer system.

The issue of producing a resettable semiconductor memory, which involves using a single command to write all "0"s or all "1"s into every memory location, has been frequently discussed. The most straightforward design approach to achieve this in an SRAM is to bring all word lines high, which consequently requires a significant amount of design and silicon overhead to control the very high current surges associated with moving large values of capacitance. Other methods have been employed using flags to output a high or low state when a given section of memory is addressed. In such devices, the individual memory cells are not immediately altered. Particular methods of resetting semiconductor memory are described in U.S. Pat. No. 5,212,663 to Leong, et al. and in U.S. Pat. No. 6,038,176 to Shyn et al.

It would therefore be advantageous to provide a method and apparatus for producing a resettable semiconductor memory without utilizing additional silicon overhead and without providing additional circuitry to control the maximum chip current.

BRIEF SUMMARY OF THE INVENTION

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In one embodiment, a method for resetting a semiconductor memory array having a plurality of semiconductor memory cells is provided. Each semiconductor memory cell has at least a volatile memory cell having a bit line pair with a first bit line and a second bit line. The first bit lines of each semiconductor memory in a column of the array are coupled together and the second bit lines are coupled together. The first and second bit lines are connected to an array reset circuit for independently grounding and applying voltage to the first and second bit lines. A node supplying power to each of the volatile memory cells is grounded by connecting the node to a ground node for each of the cells where the ground node has a means for limiting current flowing through the ground node coupled to the volatile memory cell ground node and a main ground node. The means for limiting current is set to a predetermined current limit.

The first bit line of the bit line pair is grounded independent of the second bit line in each column in the array using an array reset circuit. A column of volatile memory cells in the semiconductor memory array is connected to an array reset circuit that is configured to both ground and apply voltage to the first bit line independent of the second bit line. A voltage representing a high state is then applied to each of the second bit lines of the bit line pairs in the semiconductor memory array. A voltage representing a high state is applied to the word line coupled to the volatile memory cell. The supply node from the ground node for each of the volatile memory cells and a voltage representing a high state is applied to the supply node thereby removing the current limit between the node supplying power and the volatile memory cell ground node.

In another embodiment, a semiconductor memory reset for use with a semiconductor memory cell is provided. The reset comprises a circuit with a number of transistors for use with a semiconductor memory cell having a volatile cell and a non-volatile cell. The non-volatile cell is coupled to the volatile cell to transmit a bit of data there between. The volatile cell is configured to receive a bit of data from an exterior source, retain a bit of data and transmit a bit of data to said exterior source. The volatile cell loses a retained bit of data when power is removed from said volatile cell. The non-volatile cell also comprises a first and second transistor trigate structure having a number of series connected transistors, each trigate structure coupled to the volatile cell. Each trigate has a store transistor, a recall transistor and a memory transistor. When storing data, one transistor trigate is configured as an erase trigate and the other transistor trigate is configured as a store trigate. The store transistors are configured for connecting and disconnecting the non-volatile cell from said volatile cell. The recall transistors are configured for connecting and disconnecting said non-volatile cell from a power source. The memory transistors are configured for storing a bit of data received from the volatile cell and transmitting a bit of data to the volatile memory cell. The reset also comprises a current limiting means coupled to a ground node of the memory cell where the current limiting means is configured for limiting the flow of current from the volatile memory cell to the memory ground node. The reset also has an array reset circuit coupled to a bit line pair of the volatile memory. The array reset circuit is configured for independently controlling the voltage applied to each bit line in said bit line pair.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION OF THE PREFERRED EMBODIMENTS

A system and method for resetting the memory locations in a non-volatile SRAM is disclosed. The disclosed method uses a single command to write all 0's or all 1's into every memory location.

Figure 1:
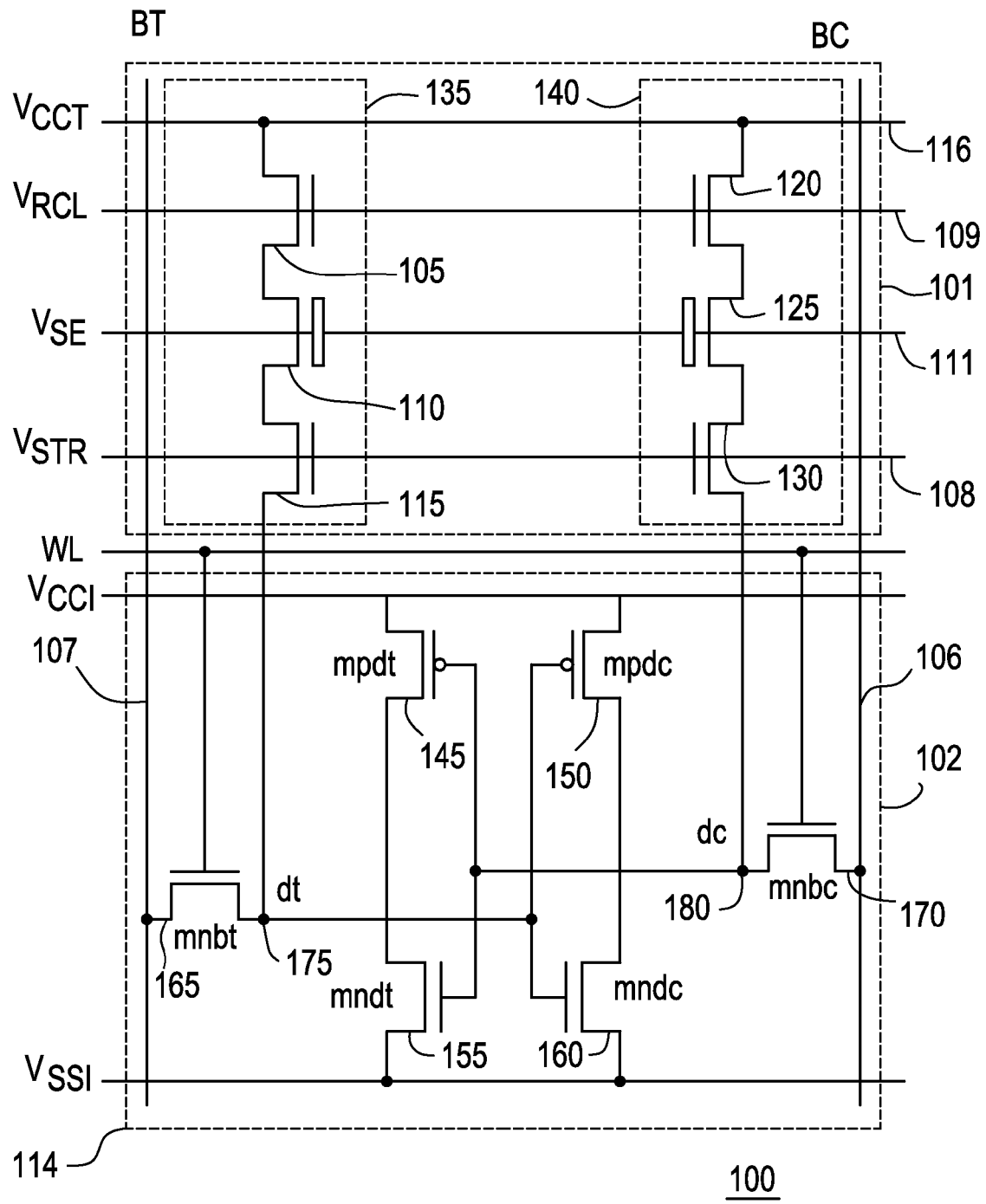
FIG. 1 is a schematic diagram illustrating an nvSRAM memory cell in accordance with one embodiment of the present invention.

FIG. 1 illustrates a typical nvSRAM cell 100 with a single SRAM and a series-connected, non-volatile memory cell, hereinafter referred to as nvSRAM device 100 in accordance with the following invention. While the nvSRAM device 100 is illustrated as having a single nvSRAM memory cell (in this case, the single SRAM and a single non-volatile memory cell), it should be appreciated that an nvSRAM device typically includes a plurality of nvSRAM cells that are integrated with a controller onto a single semiconductor chip to form an array. The array may be of any size, in one embodiment the array size is 4 Mb, which equates to an array of 2048 rows and 2048 columns for a total number of 4,194,304 nvSRAM cells in the array.

A basic nvSRAM cell 100 is comprised of a static random access memory (SRAM) cell 102 that is capable of communicating a bit of data to and from an exterior environment and a non-volatile (nv) cell 101 for providing backup storage to the SRAM cell in the event power is removed from the nvSRAM cell 100. More particularly, the SRAM cell 102 is capable, as long as power is being provided, of receiving a bit of data from an exterior environment, retaining the bit of data, and transmitting the bit of data back to the exterior environment. If, however, power is removed from the SRAM cell 102, the SRAM cell will lose the bit of data. The nv cell 101 prevents loss of the bit of data by providing the capability to receive the bit of data from the SRAM 102, retain the bit of data in the absence of power being provided to the SRAM cell 102, and return the bit of data to the SRAM cell 102 when power is restored. For example, if there is a possibility of power to the SRAM cell 102 being lost, the bit of data can be transferred from the SRAM cell 102 to the nv cell 101 in a store operation. At a later time, the bit of data can be returned from the nv cell 101 to the SRAM cell 102 in a recall operation. The SRAM cell 102 can then transmit the bit of data to the exterior environment, if desired.

Typically, the basic nvSRAM cell 100 is combined with other nvSRAM cells to form a memory array that is integrated onto a single semiconductor chip. Typical nvSRAM memory arrays are comprised of 1,048,576 nvSRAM cells. The motivation for creating integrated semiconductor chips with ever larger arrays of nvSRAM cells is that the area per cell decreases as more cells are integrated onto a chip. For example, four chips, each with arrays of 262,144 nvSRAM cells (an array of 512×512), occupy a greater surface area than a single chip with an array of 1,048,576 nvSRAM cells (an array of 1024×1024). The area occupied by a memory chip is important because many applications for the chip, such as personal computers, are continually attempting to provide more memory in less space.

In the illustrated example, the volatile portion 102 is a six transistor Static Random Access Memory (SRAM) cell. The word static indicates that the memory retains its contents as long as power remains applied. Random access means that locations in the memory can be written to or read from in any order, regardless of the memory location that was accessed last.

SRAM cell 102 typically has three states: standby, writing and reading. In the standby state, the circuit is idle waiting for a read or a write operation to occur. In stand-by mode operation, the word line WL is not asserted and so transistors 165, 170 disconnect the SRAM cell 102 from the bit lines BT 107 and BC 106. The first cross coupled inverter formed by transistors 145, 155 and the second cross coupled inverter formed by transistors 150, 160 continue to reinforce each other and the data remains unchanged.

In the read state, data within SRAM cell 102 is requested. Assume for purposes of explanation that the contents of the memory of SRAM cell 102 is a 1 stored at dt 175 and a 0 stored at dc 180. The read cycles starts by pre-charging both the bit lines to a logical 1, then asserting the word line WL, thereby enabling both transistors 165, 170. The values stored in dt 175 and dc 180 are transferred to the bit lines BT 107 and BC 106 by leaving BT at its pre-charged value and discharging BC through transistor 170 and transistor 160. On the BT side, transistor 165 is cutoff because the $V_{GS}$ on this transistor equals 0V, and thus BT remains pre-charged at logic 1. If, however, the contents of the memory of SRAM cell 102 was a logic 0, the opposite would happen and BC would be pulled towards a logic 1 and BT would discharge through transistor 165 and transistor 155.

In the write state, the contents of SRAM cell 102 is updated. The write cycle begins by applying the value to be written to the bit lines BT 107 and BC 106. Assume, for example, the dt 175 is at a logic level 1 and dc 180 is at a logic level 0. If a logic 0 is desired to be written, then bit line BT 107 is taken to ground while BC 106 is pre-charged to Vcc. Upon asserting the word line, the high node dt 175 inside the SRAM cell 102 gets discharged through transistor 165 to ground and the cell flips its state, thus writing a logic 0 into the cell.

Each bit in an SRAM is stored on four transistors that form two cross-coupled inverters. The storage cell has two stable states, which are used to denote a 0 and a 1. Two additional transistors serve to control access to a storage cell during read and write operations. Accordingly, six transistors store one memory bit.

Access to each cell is enabled by the word line (WL) 121 that controls the two transistors 165, 170. Transistors 165, 170 control whether the cell should be connected to the bit lines BT 107 and BC 106. Transistors 165, 170 are also used to transfer data for both the read and write operations. Two bit lines BT and BC are not required, however, both the true signal and the complement of that signal provide improved noise margins.

Generally, as illustrated in FIG. 1, nvSRAM cell 100 comprises a plurality of n-channel, Field-Effect Transistors (FETs); a plurality of nonvolatile elements, such as nonvolatile transistors or capacitors; and a plurality of p-channel FET load devices. It should, however, also be appreciated that other types load devices, such as resistors and a combination of different types of transistors may utilized.

As shown in FIG. 1, transistor mpdt 145 and mndt 155 form the first inverter and transistors mndt 160 and mpdc 150 form the second inverter. The output of the first inverter dt 175 is coupled to the input of the second inverter and the output of the second inverter dc 180 is coupled to the input of the first inverter. The configuration of the first and second inverters form the latch in the SRAM cell 102. There are two pass transistors 165, 170 that are driven by the signal WL 121. The first pass transistor mnbt 165 connects the bit line BT 107 to the data true node 175 and the second pass transistor mnbc 170 connects the bit-line complement BC 106 to the data complement node dc 180.

The nonvolatile portion 101 includes a first silicon oxide nitride oxide semiconductor (SONOS) FET 110 and a second SONOS FET 125 for respectively storing the state of the SRAM cell 102. The state of SRAM cell 102 is stored in the first and second SONOS FETs 110, 125 by performing a store operation. For example, if the first SRAM FET 155 is in an OFF state and the second SRAM FET 160 is in an ON state, the store operation would reflect this state of the first and second SRAM FETs 155, 160 by forcing the threshold voltage for turning ON the first SONOS FET 110 to be less than the threshold voltage for turning ON the second SONOS FET 125. This forcing is accomplished by appropriately cycling a $V_{SE}$ signal applied to the gates of SONOS FETs 110, 125. It should be appreciated that the SONOS FETs 110, 125 can be replaced with other types of nonvolatile storage elements, such as silicon nitride oxide semiconductor (SONOS) transistors or, with some circuit modifications, floating gate transistors, ferroelectric transistors, and capacitors to name a few.

The nonvolatile portion 101 further includes a first store FET 115 and a second store FET 130 that operate as switches during store and recall operations to appropriately configure the nonvolatile portion 101 for the transfer of a bit of data between the volatile portion 102 and the nonvolatile portion 101. More specifically, the first and second store FETs 115, 130 function to connect the nonvolatile portion 101 to the volatile portion 102 during store and recall operations and to otherwise disconnect the nonvolatile portion 101 from the volatile portion 102. The state of the first and second store FETs 115, 130 is controlled by a $V_{STR}$ signal that is applied to the gates of the FETs. More specifically, if the $V_{STR}$ signal is LOW, the first and second store FETs 115, 130 are turned OFF to disconnect the nonvolatile portion 101 from the volatile portion 102. Conversely, if the $V_{STR}$ signal is HIGH, the first and second store FETs 115, 130 are turned ON to connect the nonvolatile portion 101 to the volatile portion 102. Typically, a LOW signal is approximately 0V and a HIGH signal is approximately 1.8V.

The nonvolatile portion 101 further includes a first recall FET 105 and a second recall FET 120 that also function as switches to place the nonvolatile portion 101 in the appropriate configuration for transferring a bit of data between the volatile portion 102 and the nonvolatile portion 101 during store and recall operations. More specifically, the first and second recall FETs 105, 120 function to connect the nonvolatile portion 101 to $V_{CCT}$ during a recall operation and to disconnect the nonvolatile portion 101 from the $V_{CCT}$ during a store operation and otherwise. The first and second recall transistors 105, 120 are turned OFF during a store operation. The state of the first and second recall FETs 105, 120 is controlled by a $V_{RCL}$ signal that is applied to the gates of the FETs. More specifically, if the $V_{RCL}$ signal is LOW, the first and second recall FETs 105, 120 are turned OFF to disconnect the nonvolatile portion 101 from $V_{CCT}$. Conversely, if the $V_{RCL}$ signal is HIGH, the first and second recall FETs 105, 120 are turned ON to connect the nonvolatile portion 101 to $V_{CCT}$. In a preferred embodiment of the present invention, the control signals on the $V_{RCL}$, $V_{SE}$, $V_{STR}$ and word lines WL are provided by a device control unit (illustrated in FIG. 2).

Figure 2:
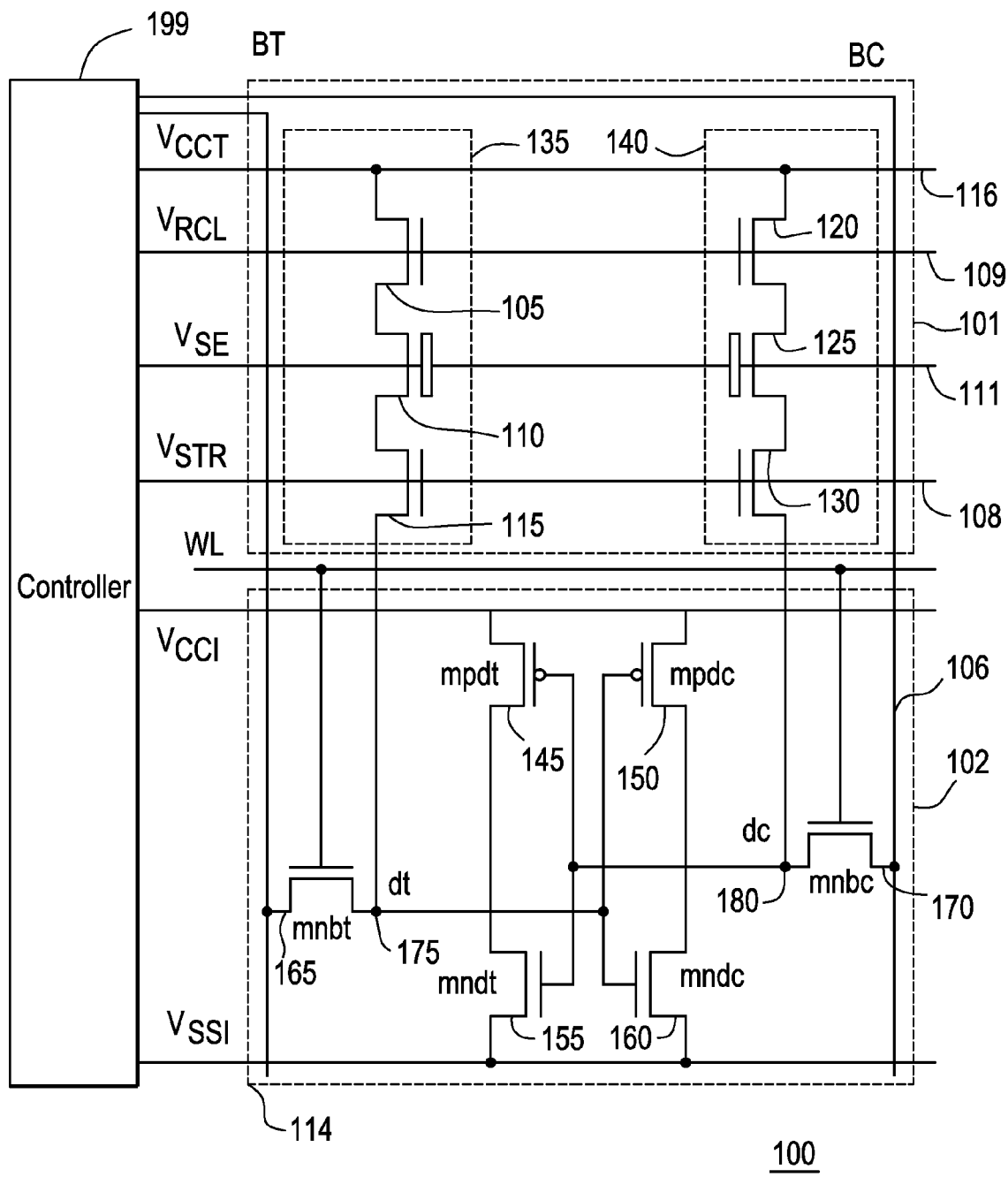
FIG. 2 is a schematic diagram illustrating an nvSRAM memory cell of FIG. 1 with an attached controller.

As illustrated in FIG. 2, a controller 199 is included in the nvSRAM device 100 for (1) providing signals to SRAM cell 102 to transfer a bit of data between the SRAM cell 102 and the exterior environment; (2) providing signals to the SRAM cell 102 and the non-volatile portion 101 to copy a bit of data from the SRAM cell 102 into the non-volatile portion 101, i.e., cause a store operation to be performed; and (3) providing signals to the SRAM cell 102 and the non-volatile portion 101 to copy a bit of data from the non-volatile portion 101 to the SRAM cell 102, i.e., cause a recall operation to be performed. The controller 199 performs the noted operations based upon signals received from a device, typically a microprocessor or a state machine, that is located exterior to the nvSRAM device 100. For example, if a microprocessor required the bit of data stored in the SRAM 102, it would issue a command to the controller 199. In response, the controller 199 would provide the signals to the SRAM cell 102 to cause the bit of data in the SRAM cell 102 to be transferred to the exterior environment. The microprocessor can also request a store or recall operation with respect to one or the other of the non-volatile memory cells in the non-volatile portion 101.

The controller also performs certain operations without direction from a microprocessor. For instance, the controller 199 is capable of independently sensing when power is initially being applied to the device 100 and, in response, causing a recall operation (power-up recall operation) to be performed with respect to one of the non-volatile memory cells in the non-volatile portion 101. Conversely, the controller 199 is capable of sensing when power is being removed from the device 100 and, in response, causing a store operation (power-down store operation) to be performed with respect to one of the non-volatile memory cells in the non-volatile portion 101. The non-volatile memory cell in the non-volatile portion 101 to which the bit of data in the SRAM cell 102 is transferred in the case of a power-down and the non-volatile memory cell in the non-volatile portion 101 from which a bit of data is recalled in the event of a power-up is established in the nvSRAM 100 during manufacture. Alternatively, the nvSRAM 100 is designed to allow the user to configure stores or recalls on the non-volatile memory cells. This configurability can be achieved via a command that is issued to the nvSRAM 100 or any of the other ways known in the art.

It should be appreciated that other nonvolatile configurations are possible to achieve the functions of the nonvolatile portion 101 of the cell 100 and the invention is in no way limited to the particular configuration illustrated in FIG. 1. The particular configuration utilized in any application will depend upon both technological and performance criteria.

During normal SRAM cell operation, node $V_{STR}$ is held low which disconnects the nonvolatile section 101 of the nvSRAM cell from the volatile section 102. In other words, there is typically no communication between volatile section 102 and nonvolatile section 101 of the memory cell 100. The volatile section 102 of memory cell 100 is accessed in the following manner. The word line, WL 121, is raised to approximately 1.8V to turn on the pass transistor gates 165, 170 and the data is read or written differentially through the bit lines, BT 107 and BC 106. The transfer of data from the volatile section 102 to the non-volatile section 101, i.e. a STORE operation, takes place in two steps, during which the word line, WL 121, is OFF or at 0V (i.e., ground).

During the first step, the erase portion of the STORE cycle, nonvolatile control lines $V_{STR}$ 108 and $V_{RCL}$ 109 remain low or OFF, which is typically 0V. Then, non-volatile transistor gate of SONOS transistors 110, 125 is pumped down to a negative supervoltage through node $V_{SE}$ 111 sufficient to positively charge the nitride dielectric through direct tunneling across the ultrathin tunnel oxide. In a typical arrangement, the negative supervoltage is approximately equal to −10V. Node $V_{SE}$ 111 is held at the negative supervoltage long enough to convert all the threshold voltages, $V_T$, of all the nitride transistors in the array to equal depletion values. The erase portion of the STORE cycle is completed by discharging $V_{SE}$ back to ground.

To program the non-volatile SRAM from the data in the volatile SRAM, assuming that the last SRAM write has left a logic "1," which leaves the data true node of the SRAM cell at 1.8V and the data complement node at a logic level 0. With the word line 121 to the SRAM cell 102 at ground, and the bit line pairs BT 107 and BC 106 maintained at 1.8V, the VSTR signal that gates the first and second store transistors is turned ON by raising VSTR to 1.8V. Next, a programming pulse and programming voltage of approximately 10V is applied on VSE, which gates the first and second SONOS transistors. The store transistor with its gate and source voltage both at 1.8V is cutoff, while the store transistor with its gate voltage 1.8V and its source voltage at 0V is ON and puts the 0V on the source node of the SONOS transistor on the dc side of the SRAM cell. This SONOS transistor gets programmed as electrons tunnel into the nitride and get stored, thus raising the threshold voltage of the SONOS transistor on the dc side of the SRAM cell. The SONOS transistor on the dt side of the SRAM cell stays erased as its source and drain node couple up with the VSE voltage. Thus, a depletion transistor and an enhancement mode transistor are formed on both sides of the trigate.

The RECALL cycle begins by clearing the existing SRAM data, first by discharging the bit lines, BT 107 and BC 106, clamping $V_{CCI}$ to $V_{SSI}$ and then by turning on the word line, WL 121. With word line 121 ON and the bit lines BT 107 and BC 106 at ground, the data nodes dt 175 and dc 180 are discharged to ground. The word line 121 is then returned to ground. Both nodes $V_{STR}$ and $V_{RCL}$ are turned on, providing a charging path to the internal nodes of the volatile section 102 through the nonvolatile section 101 to the power supply. With nonvolatile gate, $V_{SE}$, held at ground and assuming the last STORE operation left SONOS transistor 110 erased and SONOS transistor 125 programmed, and assuming that the erase threshold is −1V and the program threshold is +1V, the SONOS transistor 110 will conduct current while the SONOS transistor 125 will not because its gate voltage is below its VT. Node dt 175 charges up high, while node dc 180 remains low, thereby reestablishing the data corresponding to the last STORE cycle as explained above. The RECALL operation is completed by powering up the SRAM and returning all control lines to their default states.

Figure 3:
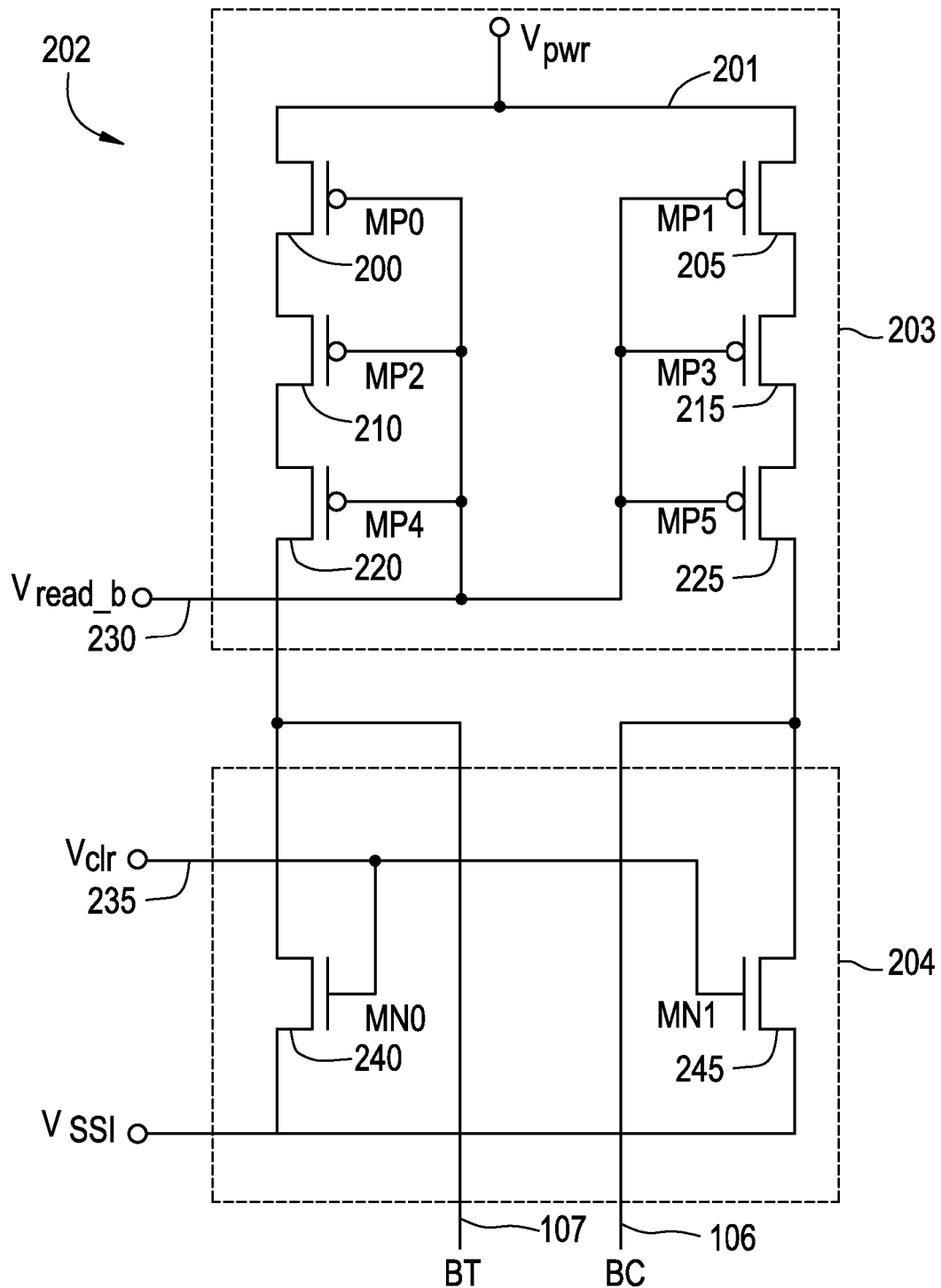
FIG. 3 is a schematic diagram illustrating a RECALL function for an nvSRAM cell of FIG. 1.

FIG. 3 illustrates a prior art recall control circuit 202 for driving the bit lines BT 107 and BC 106 simultaneously to either the ON or OFF states, i.e. HIGH or LOW respectively. More particularly, recall control circuit 202 regulates the voltage on the bit lines, and therefore within the volatile portion 102 for, among other things, properly discharging the interior nodes dt 175 and dc 180 of memory cell 100.

Recall control circuit 202 is comprised of a first circuit portion 203 and a second circuit portion 204. First circuit portion 203 has a first plurality of series connected p-channel transistors 200, 210, 220 and a second plurality of series connected p-channel transistors 205, 215, 225 that act as a load for the bit lines BT 107 and BC 106 respectively. The sources of transistor 200 and transistor 205 are connected to a power source $V_{PWR}$ 201. The drains of transistors 220 and transistor 225 are connected to the BT 107 and BC 106 respectively. The gates of transistors 200, 210, 220 are connected together and coupled to node $V_{read\_b}$. The gates of transistors 205, 215, 225 are connected together and coupled to node $V_{read\_b}$. Second circuit portion 204 has a first n-channel transistor 240 and a second n-channel transistor 245 that couple the bit lines BT 107 and BC 106 to ground node $V_{SSI}$. The gate of transistor 240 is coupled to $V_{clr}$, the source is connected to ground node $V_{SSI}$ and the drain is coupled to BT 107. The gate of transistor 245 is coupled to $V_{clr}$, the source is connected to ground node $V_{SSI}$ and the drain is coupled to BC 106.

In operation, signals $V_{read\_b}$ and $V_{clr}$, for a RECALL operation, are both at a HIGH state, which for the 0.13μ technology, is at a voltage of 1.8V. Setting $V_{read\_b}$, and $V_{clr}$ to a HIGH state turns the p-channel transistors 200, 205, 210, 215, 220, 225 off and turns n-channel transistors 240, 245 on. As a result, bit lines BC 106 and BT 107 are grounded to $V_{SSI}$. It should be appreciated that $V_{read\_b}$ and $V_{clr}$ are maintained at a LOW state, or 0.0V, for a READ operation as described above. Setting $V_{read\_b}$ and $V_{clr}$ to a LOW state turns the p-channel transistors 200, 205, 210, 215, 220, 225 on, and turns n-channel transistors 240, 245 off. As a result, the p-channel transistors act as a weak pull-up load for bit lines BC 106 and BT 107 are coupled to $V_{PWR}$ 201.

Figure 4:
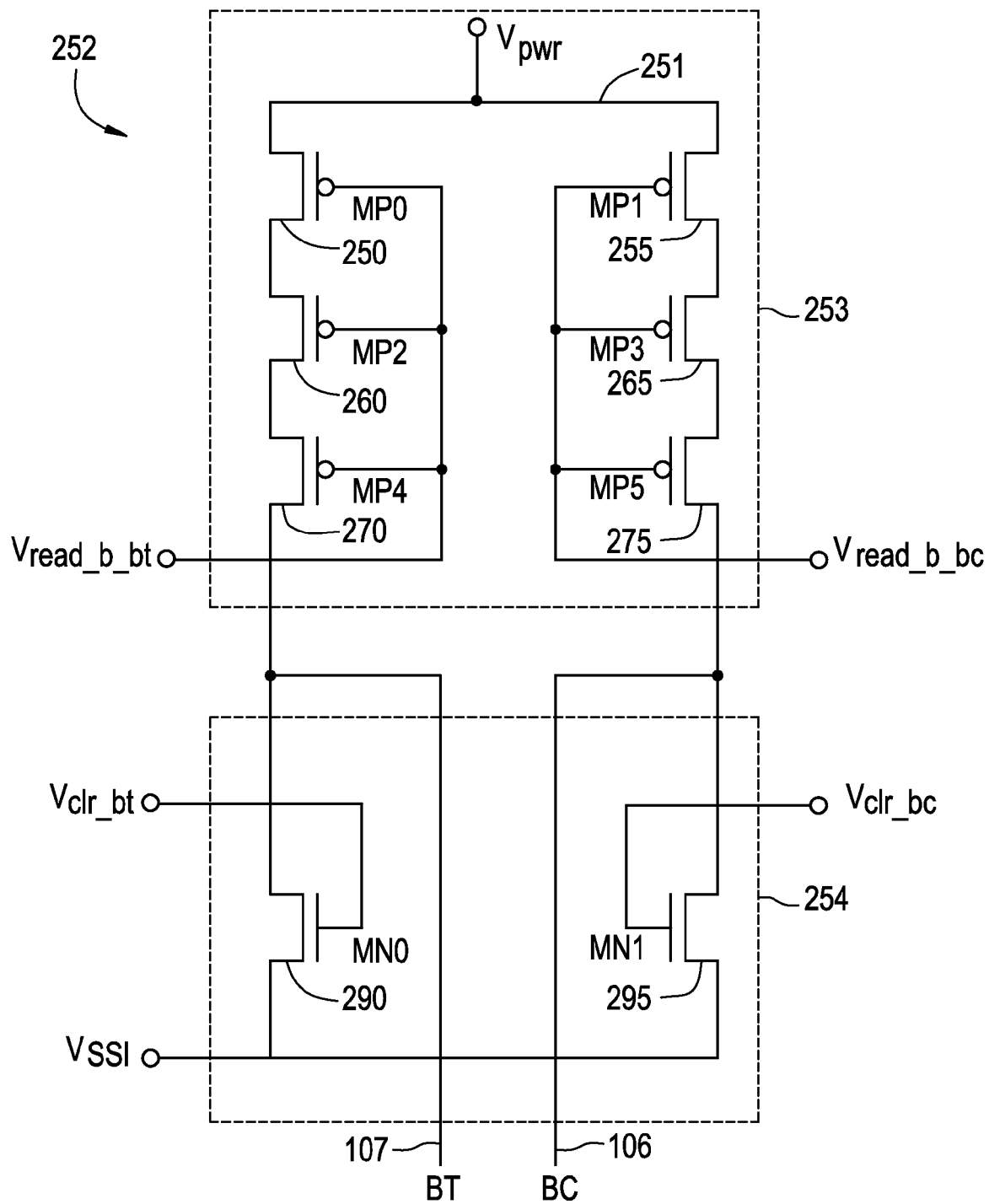
FIG. 4 is a schematic diagram illustrating a modified RECALL function to reset the nvSRAM cell of FIG. 1.

FIG. 4 illustrates an array reset circuit 252 in accordance with the present invention. Array reset circuit 252 is capable of independently operating bit lines BT 107 and BC 106. In other words, array reset circuit 252 may independently drive the state of bit line BT 107 either HIGH or LOW—which in the present invention is 1.8V or 0.0V respectively—independent of the state of bit line BC 106. At the same time, bit line BC 106 may be driven HIGH or LOW, independent of the state of the bit line BT 107.

Array reset circuit 252 is comprised of a first circuit portion 253 and a second circuit portion 254. First circuit portion 253 has a first plurality of series connected p-channel transistors 250, 260, 270 and a second plurality of series connected p-channel transistors 255, 265, 275 that act as a load for the bit lines BT 107 and BC 106 respectively. The sources of transistor 250 and transistor 255 are connected to a power source $V_{PWR}$ 251. The drains of transistors 270 and transistor 275 are connected to the BT 107 and BC 106 respectively. The gates of transistors 250, 260, 270 are connected together and coupled to node $V_{read\_b\_bt}$. The gates of transistors 255, 265, 275 are connected together and coupled to node $V_{read\_b\_bc}$. Second circuit portion 254 has a first n-channel transistor 290 and a second n-channel transistor 295 that couple the bit lines BT 107 and BC 106 to ground node $V_{SSI}$. The gate of transistor 290 is coupled to $V_{clr\_bt}$, the source is connected to ground node $V_{SSI}$ and the drain is coupled to BT 107. The gate of transistor 295 is coupled to $V_{clr\_bc}$, the source is connected to ground node $V_{SSI}$ and the drain is coupled to BC 106.

In operation, for an array reset operation, $V_{CCI}$ and $V_{SSI}$ in memory cell 100 are clamped close to chip ground $V_{SS}$ (not shown). A single bit line, for purposes of illustration bit line BC 106 is driven LOW or to chip ground. Accordingly, $V_{read\_b\_bc}$ and $V_{clr\_bc}$ are maintained HIGH and $V_{read\_b_{bt}}$ and $V_{clr\_bt}$ are maintained LOW. Driving $V_{read\_b\_bc}$ and $V_{clr\_bc}$ HIGH turns OFF the series connected p-channel transistors 250, 255, 260, 265, 270, 275 and turns the re-channel transistor 240 to an ON state. Accordingly, bit line BC 106 is connected to ground node $V_{SSI}$ and thus driven LOW to chip ground. Driving $V_{read\_b\_bt}$ and $V_{clr\_bt}$ LOW turns ON the series connected p-channel transistors 250, 255, 260, 265, 270, 275 and turns the n-channel transistor 240 OFF. The series connected p-channel transistors become a load for bit Line BT 107 and thus energize BT 107 to a HIGH state.

The word line WL is then asserted while $V_{STR}$, $V_{SE}$ and $V_{RCL}$ supplying the transistors 105, 110, 115, 120, 135, 130 in the non-volatile section 101 are maintained LOW. The node DT 175 is driven to a value of 1.8V–$V_t$, where $V_t$ is the threshold voltage of the pass transistor mnbt 175 gated by the word line WL and the node DC 180 is pulled to ground. Then, for purposes of cell regeneration, $V_{CCI}$ is unclamped from $V_{SSI}$ and forced to 1.8V. The volatile portion 102 of the memory cell 100 latches to reinforce the reset state. The current limit set up by current limit means 300 shown in FIG. 6, that is effectively in place between $V_{CCI}$ and $V_{SSI}$ is removed.

The above referenced array reset circuit may be used to perform a voltage stress test for determining the weak transistors in a transistor array. In operation, the reset operation is performed and then the bias across the transistors is maintained for a longer period of time. There is no need to cycle through the addresses and apply the bias sequentially. Three of the six transistors in the volatile portion 102 will be biased when one bit line is HIGH and one bit line is LOW, so a two cycle operation will effectively test all transistors in an array. The reset procedure is also useful for a wafer level burn-in for applying the voltage stress at both an elevated temperature and voltage to locate the weak transistors.

Figure 5:
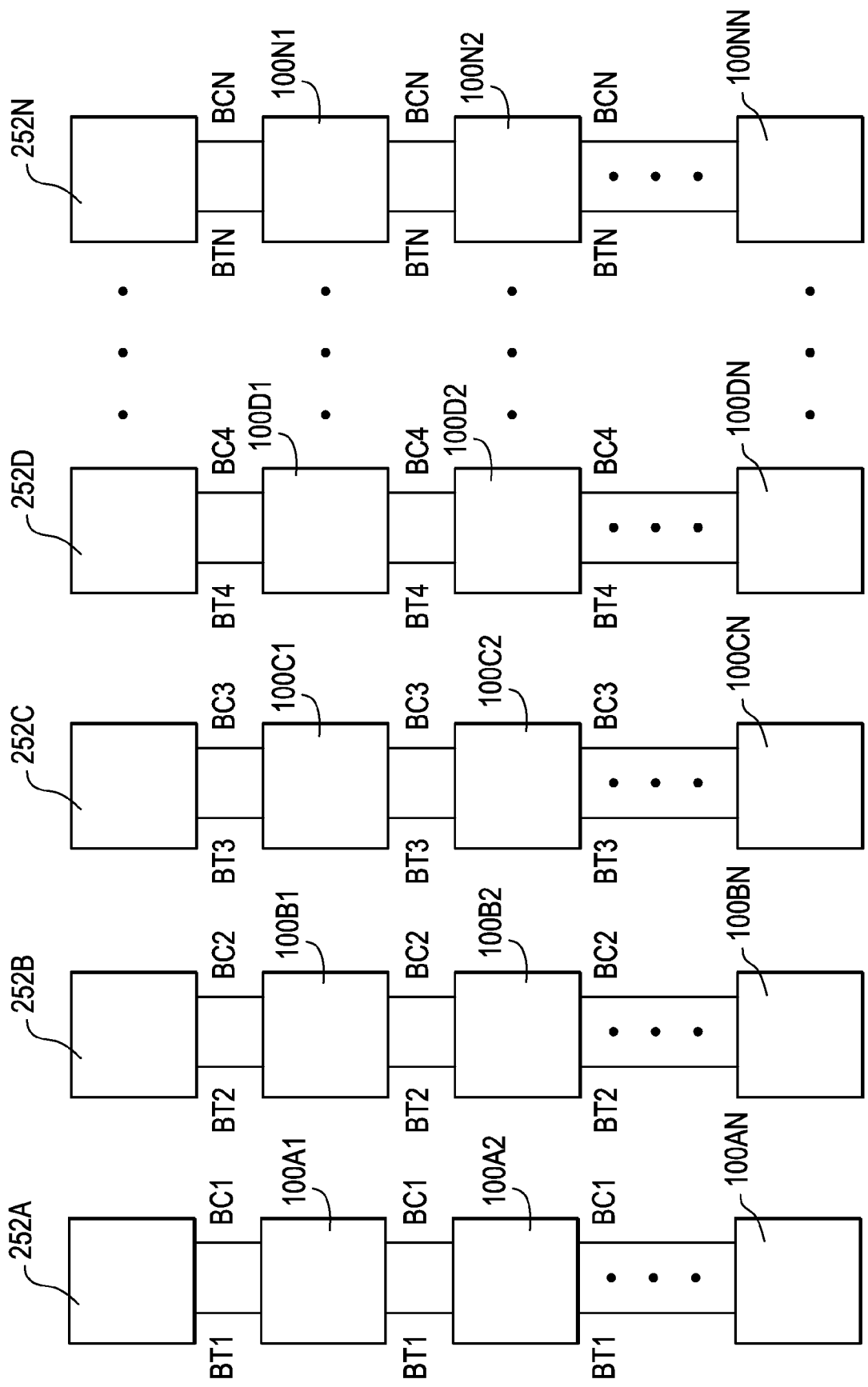
FIG. 5 is a block diagram of an array of memory cells having a number of rows and columns including an array reset circuit coupled to the bit line pairs of memory cells in each column.

FIG. 5 illustrates an array of semiconductor memory cells where each column is coupled to an array reset circuit. A typical array of memory cells would have 1024 columns and 1024 rows making up a total of 1,048,576 total memory cells—i.e., a 1 megabit array. However, as one skilled in the art will appreciate, the array may be of any size having a number of rows and columns corresponding to the desired size. As shown, each column has an array reset circuit 252A-252N associated therewith. For each column, the BT and BC output from the array reset circuit is coupled to each of the bit lines BT and BC in the column. For example, the bit lines of array reset circuit 252A are connected to the bit lines of each of the memory cells 100A1-100AN represented as bit lines BT1 and BC1. In this manner, the array reset circuit for a particular row may independently ground and apply voltage to each of the bit lines in a particular column in an array in the same operation as described above for a single memory cell.

Figure 6:
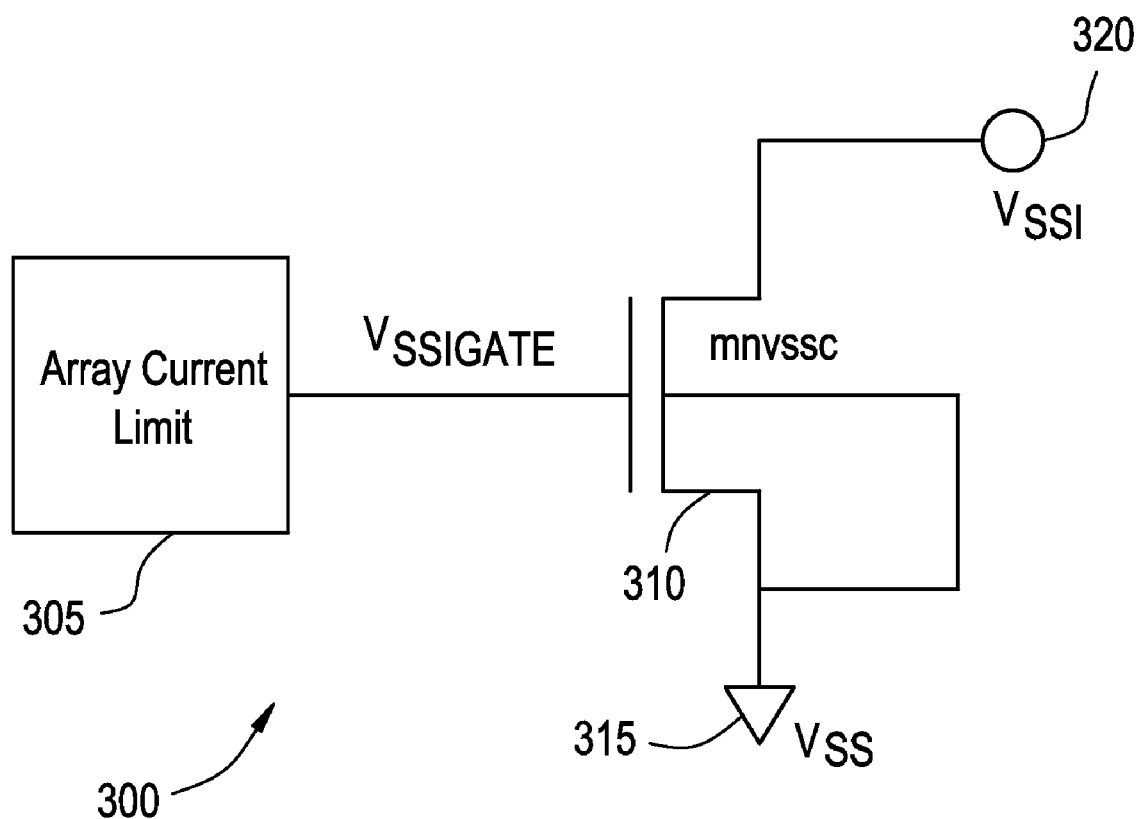
FIG. 6 is a schematic diagram of a current limiting circuit coupled between $V_{SS}$ and $V_{SSI}$ for limiting the current in each memory cell of FIG. 1 in the array of FIG. 5.

FIG. 6 shows a current limiting means 300, which in the illustrated embodiment is a current mirror, having a current limiting transistor 310 for limiting the current between the memory cell ground $V_{SSI}$ 320 and the main chip ground $V_{SS}$ 315. Current limiting transistor 310 is connected to $V_{SSI}$ for each memory cell 100 in a memory cell array. In operation, the current limiting transistor 310 functions to limit the flow of current into the memory cell ground $V_{SSI}$ 320.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

We claim:

1. A method of setting a state of a volatile memory cell, comprising:
    grounding a power supply to the volatile memory cell;
    driving a first bit line to the volatile memory cell to a first defined state, the first defined state of the first bit line controllable independently of a defined state of a second bit line to the volatile memory cell;
    driving a word line of the volatile memory cell to a word line state; and
    ungrounding the power supply to the volatile memory cell.

2. The method of claim 1, further comprising:
    the volatile memory cell capable of being coupled and decoupled with a stored state of a nonvolatile counterpart memory cell; and
    decoupling the volatile memory cell from the nonvolatile counterpart memory cell during the setting of the state of the volatile memory cell.

3. The method of claim 1, further comprising:
    maintaining the first bit line in the first defined state longer than necessary to set a stored state of the volatile memory cell to the first defined state, in order to stress test a first set of transistors of the volatile memory cell.

4. The method of claim 3, further comprising:
    driving the first bit line to a second defined state;
    independently of the driving the first bit line to the second defined state, driving the second bit line to the first defined state; and
    maintaining the first bit line in the second defined state longer than necessary to set a stored state of the volatile memory cell to the second defined state, in order to stress test a second set of transistors of the volatile memory cell.

5. The method of claim 1, further comprising:
    the first defined state comprising a higher voltage than a logical HIGH voltage stored by the volatile memory cell during normal operation.

6. The method of claim 5, further comprising:
    elevating the temperature of the volatile memory cell above an expected operating temperature while performing the setting of the state of the volatile memory cell.

7. A memory cell, comprising:
    a volatile bit storage circuit coupled to first and second bit lines, to a power source, and to a ground node;
    a nonvolatile bit storage circuit coupled to receive a stored state of the volatile bit storage circuit;
    a reset circuit coupled to the volatile storage circuit, the reset circuit comprising:
        a first section coupling the first bit line to a power source that is independent of the power source of the volatile bit storage circuit;
        a second section coupling the first bit line to the ground node of the volatile bit storage circuit;
        a third section coupling the second bit line to the power source that is independent of the power source of the volatile bit storage circuit;
        a fourth section coupling the second bit line to the ground node of the volatile bit storage circuit; and
        a controller configured to control the first and second sections independently of the third and fourth sections.

8. The memory cell of claim 7, further comprising:
    the controller configured to control the first section independently of the second section; and
    the controller configured to control the third section independently of the fourth section.

9. The memory cell of claim 7, further comprising:
    the controller configured to selectively ground the volatile bit storage circuit power source.

10. The memory cell of claim 9, further comprising a current limiting transistor between the volatile bit storage circuit ground node and a ground node of a chip comprising the memory cell.

11. A memory array, comprising:
a plurality of memory cells, each memory cell comprising a volatile bit storage cell and a nonvolatile bit storage cell, each volatile bit storage cell coupled to first and second bit lines and to a volatile bit storage cell power source;
a reset circuit to selectively set all the volatile memory cells of the array each to a same first defined state, the reset circuit comprising:
a reset circuit power source that is independent of the volatile bit storage cell power source;
a first circuit to set a state of the first bit line; and
a second circuit to set a state of the second bit line independently of setting the state of the first bit line.

12. The memory array of claim 11, the reset circuit further comprising a circuit to ground the volatile bit storage cell power source while setting the volatile cells to the first defined state.

13. The memory array of claim 12, the circuit to ground the volatile bit storage cell power source further comprising current limiting transistors coupled between the ground node of each volatile bit storage cell and a ground node for the memory array.

14. The memory array of claim 11, the reset circuit further comprising a circuit to ground the first and second bit lines to the ground node of the volatile bit storage cell independently of one another.

15. The memory array of claim 11, the reset circuit further comprising a circuit to charge the first and second bit lines independently of one another via the reset circuit power source.

16. A method of setting a plurality of volatile memory cells of a memory array to a same defined state, the method comprising:

grounding a power supply to the volatile memory cells;
driving first bit lines to the volatile memory cells to a first defined state, the first defined state of the first bit lines controllable independently of a state of a second bit line to the volatile memory cells;
setting a state of word lines to the volatile memory cells;
ungrounding the power supply to the volatile memory cells.

17. The method of claim 16, further comprising:
each volatile memory cell capable of being coupled and decoupled from a stored state of a nonvolatile counterpart memory cell; and
maintaining each volatile memory cell in a decoupled state from the nonvolatile counterpart memory cell while setting the state of the volatile memory cells.

18. The method of claim 16, further comprising:
maintaining the first bit lines in the first defined state longer than necessary to set the state of the volatile memory cells to the first defined state, in order to stress test a first set of transistors of each volatile memory cell.

19. The method of claim 18, further comprising:
driving the first bit lines to a second define state different than the first defined state;
independently of the driving of the first bit lines to the second defined state, driving the second bit lines to the first defined state; and
maintaining the first bit lines in the second defined state longer than necessary to set the volatile memory cells to the second defined state, in order to stress test a second set of transistors of each volatile memory cell.

20. The method of claim 16, further comprising:
the first defined state comprising a higher voltage than a logical HIGH bit value stored by the volatile memory cells during normal operation.

* * * * *